(12) United States Patent
Zhao et al.

(10) Patent No.: US 8,228,098 B2
(45) Date of Patent: Jul. 24, 2012

(54) PULSE WIDTH MODULATION FREQUENCY CONVERSION

(75) Inventors: Bin Zhao, Irvine, CA (US); Andrew M. Kameya, Irvine, CA (US); Victor K. Lee, Irvine, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 272 days.

(21) Appl. No.: 12/537,443

(22) Filed: Aug. 7, 2009

(65) Prior Publication Data

US 2011/0032008 A1    Feb. 10, 2011

(51) Int. Cl.
  H03B 19/00    (2006.01)
  H03K 7/08    (2006.01)
(52) U.S. Cl. .................. 327/114; 327/172; 327/175
(58) Field of Classification Search .......... 327/113–122, 327/172–176; 332/109; 375/238
See application file for complete search history.

(56) References Cited

U.S. PATENT DOCUMENTS

| | | | |
|---|---|---|---|
| 4,162,444 A | 7/1979 | Rodgers | |
| 4,615,029 A | 9/1986 | Hu et al. | |
| 4,649,432 A | 3/1987 | Watanabe et al. | |
| 4,686,640 A | 8/1987 | Simison | |
| 4,907,862 A | 3/1990 | Suntola | |
| 5,025,176 A | 6/1991 | Takeno | |
| 5,038,055 A | 8/1991 | Kinoshita | |
| 5,508,909 A | 4/1996 | Maxwell et al. | |
| 5,668,611 A | 9/1997 | Ernstoff et al. | |
| 5,723,950 A | 3/1998 | Wei et al. | |
| 5,844,540 A | 12/1998 | Terasaki | |
| 5,898,329 A | 4/1999 | Hopkins | |
| 6,281,822 B1 | 8/2001 | Park | |
| 6,864,641 B2 | 3/2005 | Dygert | |
| 6,937,084 B2 | 8/2005 | Bowling | |
| 6,943,500 B2 | 9/2005 | LeChevalier | |
| 6,995,592 B2 | 2/2006 | Agarwal | |
| 7,106,294 B2 | 9/2006 | Kumamoto et al. | |
| 7,126,397 B1 | 10/2006 | Mok | |
| 7,176,948 B2 | 2/2007 | Lewis | |

(Continued)

FOREIGN PATENT DOCUMENTS

JP    2003332624 A    11/2003

(Continued)

OTHER PUBLICATIONS

PCT Search Report mailed Mar. 28, 2011 for International Application No. PCT/US2010/044067, 3 pages.

(Continued)

*Primary Examiner* — Patrick O'Neill (57) ABSTRACT

A pulse width modulation (PWM) frequency converter converts an input PWM signal to an output PWM signal having a different frequency while maintaining a substantially equal duty ratio. The PWM frequency converter samples the input PWM signal for a PWM cycle using a sampling clock. A filter module filters the resulting set of one or more PWM parameters to compensate for noise introduced by potential clock mismatch, clock jitter, ambient variations, and other non-deterministic issues, thereby generating filtered PWM parameters. The sampling employed by the filter module compares a difference between the one or more current PWM parameters and previous (or historical) PWM parameters from an earlier sampled PWM cycle to a predetermined change threshold in determining a filtered set of one or more PWM parameters. The filtered set of one or more PWM parameters then is used to generate one or more corresponding PWM cycles of the output signal.

17 Claims, 7 Drawing Sheets

U.S. PATENT DOCUMENTS

| | | | |
|---|---|---|---|
| 7,262,724 B2 | 8/2007 | Hughes et al. | |
| 7,391,280 B2 | 6/2008 | Hsu | |
| 7,436,378 B2 | 10/2008 | Ito et al. | |
| 7,511,545 B1 | 3/2009 | Kesler | |
| 7,550,932 B2 | 6/2009 | Kung et al. | |
| 7,593,243 B2 | 9/2009 | Ganev et al. | |
| 7,741,885 B1 * | 6/2010 | Guo et al. | 327/116 |
| 7,800,415 B2 | 9/2010 | Yedevelly et al. | |
| 7,843,242 B1 * | 11/2010 | Zhao | 327/175 |
| 2004/0008159 A1 | 1/2004 | Cunha et al. | |
| 2004/0208011 A1 | 10/2004 | Horiuchi et al. | |
| 2004/0232964 A1 | 11/2004 | Wiktor et al. | |
| 2004/0233144 A1 | 11/2004 | Rader et al. | |
| 2004/0251942 A1 | 12/2004 | Chiu et al. | |
| 2005/0275355 A1 | 12/2005 | Samuelsson | |
| 2006/0064609 A1 | 3/2006 | Bryan | |
| 2006/0164142 A1 | 7/2006 | Stanley | |
| 2006/0186830 A1 | 8/2006 | Shami et al. | |
| 2007/0080911 A1 | 4/2007 | Liu et al. | |
| 2007/0182701 A1 | 8/2007 | Kim et al. | |
| 2007/0253330 A1 | 11/2007 | Tochio et al. | |
| 2008/0054815 A1 | 3/2008 | Kotikalapoodi | |
| 2008/0074381 A1 | 3/2008 | Kumamoto et al. | |
| 2008/0297067 A1 | 12/2008 | Wang et al. | |
| 2009/0073735 A1 | 3/2009 | Kesler | |
| 2009/0128045 A1 | 5/2009 | Szczeszynski et al. | |
| 2009/0187925 A1 | 7/2009 | Hu et al. | |
| 2009/0230874 A1 | 9/2009 | Zhao et al. | |
| 2009/0230891 A1 | 9/2009 | Zhao et al. | |
| 2009/0273288 A1 | 11/2009 | Zhao et al. | |
| 2009/0315481 A1 | 12/2009 | Zhao | |
| 2010/0026203 A1 | 2/2010 | Zhao et al. | |
| 2010/0085295 A1 | 4/2010 | Zhao et al. | |

FOREIGN PATENT DOCUMENTS

| | | |
|---|---|---|
| JP | 2005116199 A | 4/2005 |
| WO | 2008124718 A2 | 10/2008 |

OTHER PUBLICATIONS

Notice of Allowance mailed Oct. 5, 2010 for U.S. Appl. No. 12/537,692, 13 pages.

U.S. Appl. No. 13/025,201, filed Feb. 11, 2011 entitled, "Phase-Shifted Pulse Width Modulation Signal Generation Device and Method Therefor".

Mc Nerney, Tim, "constant-current power supply for Luxeon 5W LED with low-voltage warning and shut-off Software Documentation, as shipped to Mali in first 45 prototypes," Nov. 2004, www.designthatmatters.org/ke/pubs/kled-doc.txt, 5 pages.

Maxim: "Application Note 810, Understanding Flash ADCs," Oct. 2, 2001, 8 pages.

National Semiconductor Data Sheet: "LM34321LM3432B 6-Channel Current Regulator for LED Backlight Application," May 22, 2008, pp. 1-18.

International Application No. PCT/US2009/035284, Search Report and Written Opinion, Oct. 28, 2009, 11 pages.

U.S. Appl. No. 12/703,239, filed Feb. 10, 2010, entitled "Pulse Width Modulation With Effective High Duty Resolution".

U.S. Appl. No. 12/537,692, filed Aug. 7, 2009, entitled "Phase-Shifted Pulse Width Modulation Signal Generation".

U.S. Appl. No. 12/625,818, filed Nov. 25, 2009, entitled "Synchronized Phase-Shifted Pulse Width Modulation Signal Generation".

U.S. Appl. No. 12/703,249, filed Feb. 10, 2010, entitled "Duty Transition Control in Pulse Width Modulation Signaling".

Luke Huiyong Chung, Electronic Products: "Driver ICs for LED BLUs," May 1, 2008, 3 pages.

Akira Takahashi, Electronic Products: "Methods and features of LED drivers," Mar. 2008, 3 pages.

U.S. Appl. No. 12/340,985, filed Dec. 22, 2008, entitled "LED Driver With Feedback Calibration".

U.S. Appl. No. 12/326,963, filed Dec. 3, 2008, entitled "LED Driver With Precharge and Track/Hold".

U.S. Appl. No. 12/367,672, filed Feb. 9, 2009, entitled "Configuration for Dynamic Power Control in LED Displays".

U.S. Appl. No. 12/424,326, filed Apr. 15, 2009, entitled "Peak Detection With Digital Conversion".

U.S. Appl. No. 12/504,841, filed Jul. 17, 2009, entitled "Analog-To-Digital Converter With Non-Uniform Accuracy".

U.S. Appl. No. 12/690,972, filed Jan. 21, 2010, entitled "Serial Cascade of Minimum Tail Voltages of Subsets of LED Strings for Dynamic Power Contrl in LED Displays".

U.S. Appl. No. 12/363,607, filed Jan. 30, 2009, entitled "LED Driver With Dynamic Headroom Control".

Texas Instruments Publication, "Interleaved Dual PWM Controller with Programmable Max Duty Cycle," SLUS544A, Sep. 2003, pp. 1-28.

Notice of Allowance mailed Dec. 29, 2011 for U.S. Appl. No. 12/703,249, 24 pages.

Feng et al., "A New Switched-Capacitor Frequency Modulated Driver for Light Emitting Diodes," Review of Scientific Instruments 78, 114710, American Institute of Physics, 2007, 4 pages.

Tadakuma, S. et al., "Improved PWM Control for GTO Inverters with Pulse No. Modulation," IEEE Transactions on Industry Applications, vol. 32, No. 3. Jun. 1, 1996, 7 pages.

* cited by examiner

PULSE WIDTH MODULATION FREQUENCY CONVERSION

FIELD OF THE DISCLOSURE

The present disclosure relates generally to pulse width modulation (PWM) and more particularly to frequency conversion for PWM signals.

BACKGROUND

Pulse width modulation (PWM) signals often are used for precise control of electronic devices, such as electric motors, light emitting diode (LED) backlights, switching-mode power sources, and the like. However, in many instances, the PWM signal has a frequency that can introduce undesirable effects such as electromagnetic interference (EMI), or which can result in artifacts perceptible to a user. For example, the PWM signals used to drive the LED backlight in a display device often have a frequency within the human audible range (0-20 kHz), and thus can be audibly discerned by a viewer. Further, it will be appreciated that a lower-frequency PWM signal can introduce significant droop or ripple in an output voltage controlled or otherwise affected by the frequency of the PWM signal. To address these types of issues, electronic systems often employ some form of frequency conversion for the PWM signal so as to increase or decrease the PWM frequency while maintaining the same PWM duty ratio, thereby reducing or eliminating undesired effects such as EMI and audible noise and decreasing the magnitude of any ripple or droop in any output voltage affected by the PWM signal. In one conventional frequency conversion technique, an analog approach is employed whereby an incoming PWM signal is converted to a varying voltage based on the duty ratio of the incoming PWM signal, which is then used along with a ramp signal and a plurality of reference signals to reproduce the original duty ratio of the incoming PWM signal at a different frequency. However, the noise in the representative voltage and the offsets in the comparators used to compare the representative voltage, the reference voltages, and the ramp signal prevent accurate PWM signal generation for duty ratios, particularly near 0% or near 100%. Moreover, the noise in the input PWM signal to voltage conversion and the offsets in the comparators also result in noise and offset in the generated output PWM signal.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-7 illustrate a pulse width modulation (PWM) frequency converter for converting an input PWM signal to an output PWM signal having a frequency different than the input PWM signal while maintaining a substantially equal duty ratio, as well as example systems employing the PWM frequency converter. The PWM frequency converter samples the input PWM signal for a PWM cycle using a sampling clock with a higher frequency than the frequency of the input PWM signal. A filter module filters the resulting set of one or more PWM parameters to compensate for potential clock mismatch, clock jitter, ambient variations, and other non-deterministic issues between the clock used to generate the input PWM signal and the sampling clock used to sample the input PWM signal, thereby generating filtered PWM parameters. In at least one embodiment, the sampling employed by the filter module compares a difference between the current PWM parameters and previous (or historical) PWM parameters to a change threshold in determining a filtered set of one or more PWM parameters. The filtered set of one or more PWM parameters then is used to generate one or more corresponding PWM cycles of the output signal. With the suitable selection of a sampling frequency and an appropriate change threshold for the filter, the PWM frequency converter can achieve a PWM step resolution of one (1) least significant bit (LSB) for the output PWM signal at its specified resolution, while also able to accurately produce output PWM signals across the entire duty ratio range of 0% to 100%.

Figure 1:
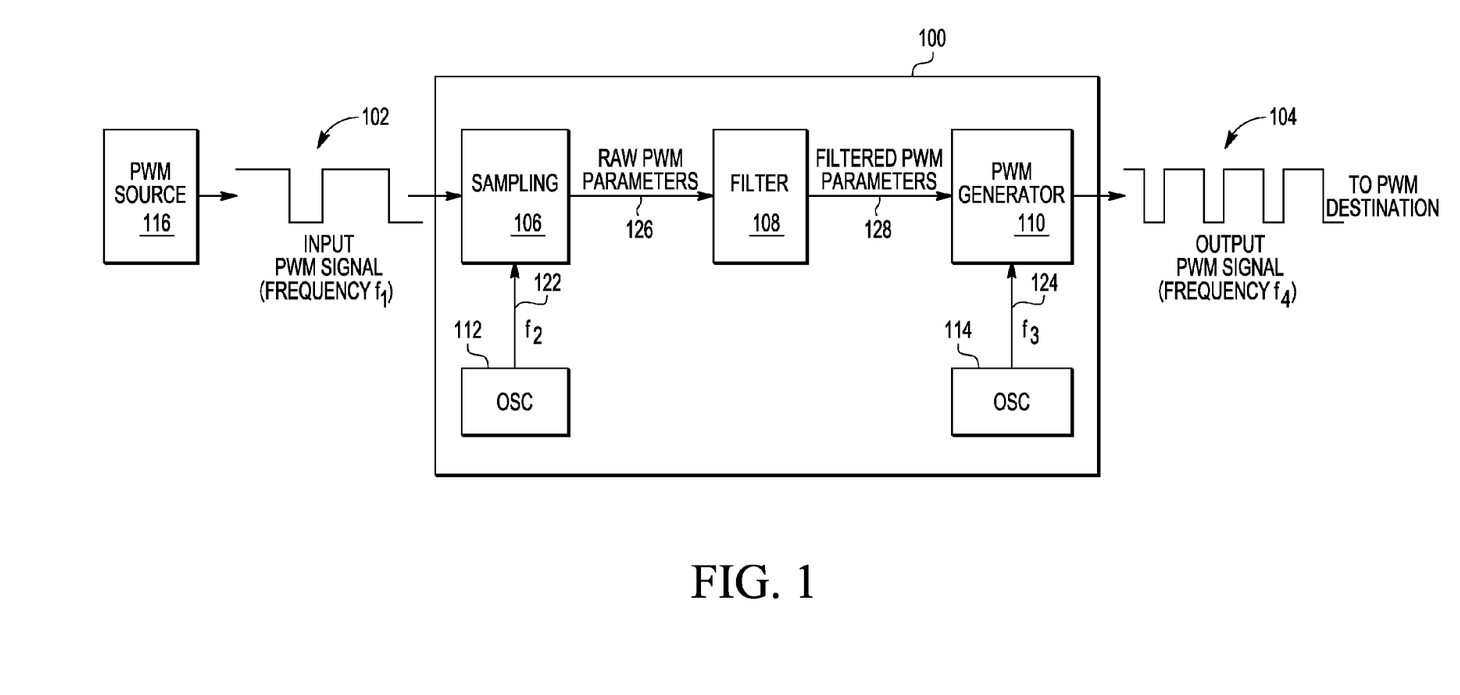
FIG. 1 is a diagram illustrating a pulse width modulation (PWM) frequency converter implementing filtering in accordance with at least one embodiment of the present invention.

FIG. 1 illustrates a PWM frequency converter 100 for converting an input PWM signal 102 to an output PWM signal 104 having a different frequency while maintaining a substantially equal duty ratio. In the depicted example, the PWM frequency converter 100 includes a sampling module 106, a filter module 108, a PWM generator module 110 and clock sources 112 and 114 (e.g., oscillators). The functionality of the various modules of the PWM generator module 110 as illustrated in FIGS. 1-7 can be implemented as hardware, firmware, one or more processors that execute software representative of the corresponding functionality, or a combination thereof. To illustrate, the functionality of certain components can be implemented as discrete logic, an application specific integrated circuit (ASIC) device, a field programmable gate array (FPGA), and the like.

In one embodiment, the input PWM signal 102 is generated by a PWM source 116 and having a frequency $f_1$. The PWM source 116 can include, for example, a video processor for a context whereby the input PWM signal 102 is a backlight control signal, a microcontroller for a context whereby the input PWM signal 102 is a motor control signal, etc. For sampling of the input signal 102 at the PWM frequency converter 100, the clock source 112 generates a sampling clock 122 having a frequency $f_2$ greater than the frequency $f_1$ of the input PWM signal 102. The clock source 114 generates a generation clock 124 having a frequency $f_3$ for generation of the output PWM signal 104 with a frequency $f_4$, where the frequency $f_4$ is a product of the frequency $f_3$ of the clock 124 and the PWM step resolution of the output PWM signal (e.g., 255*$f_3$ for an 8-bit PWM step resolution), The sampling module 106 includes an input to receive the input PWM signal 102, an input to receive the sampling clock 122, and an output to provide the results of a sampling process of the input PWM signal 102 using the sampling clock 122 as a set of raw PWM parameters 126. The filter module 108 includes an input to receive the raw PWM parameters 126 and an output to provide a set of filtered PWM parameters 128 generated on the basis of filtering of the raw PWM parameters 126. The PWM generator module 110 includes an input to receive the filtered PWM parameters 128, an input to receive the generation clock 124, and an output to provide the output PWM signal 104, whereby the PWM generator module 110 generates the output PWM signal 104 using the generation clock 124 and the filtered PWM parameters 128 as described below with reference to FIGS. 2, 4, and 5.

Figure 2:
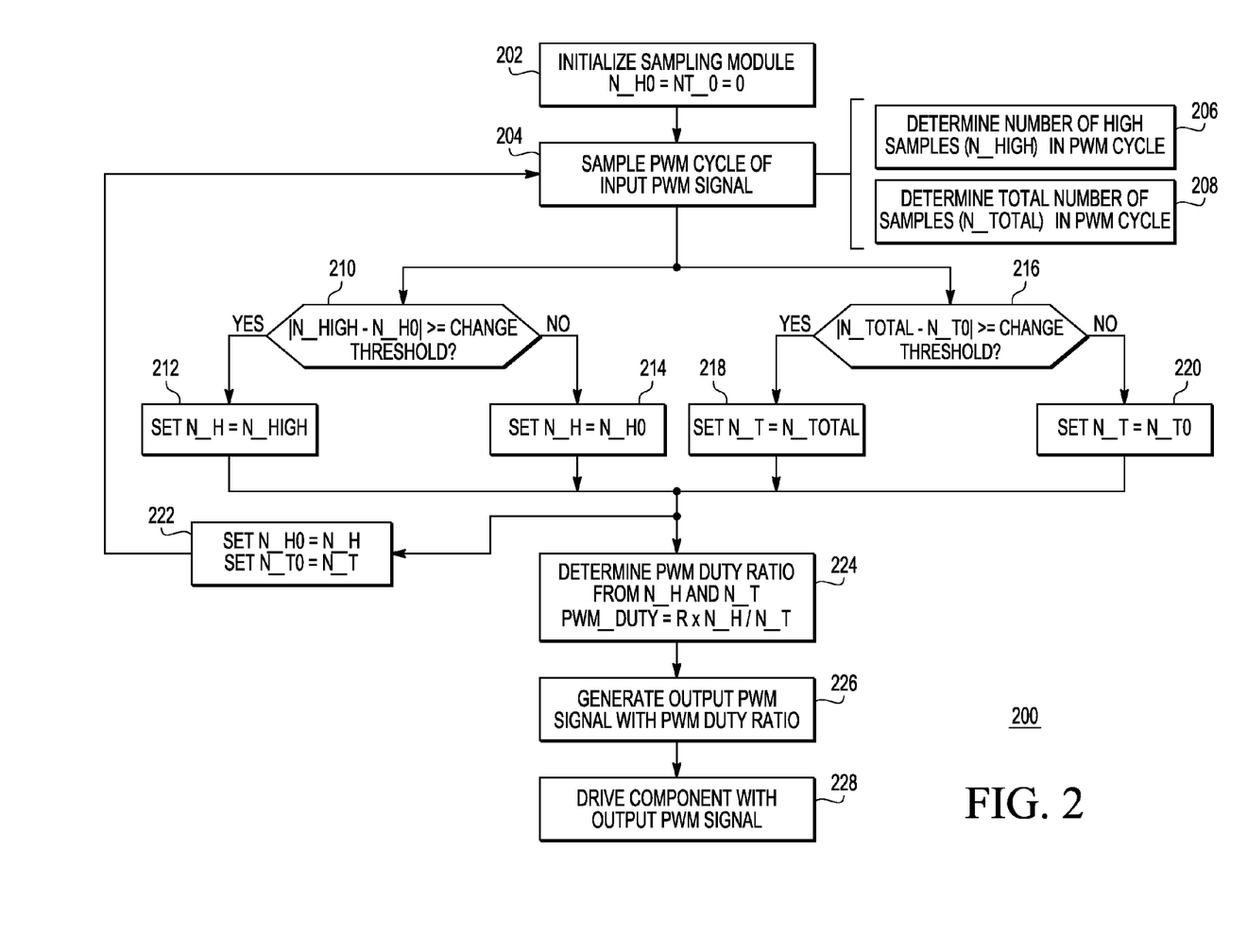
FIG. 2 is a flow diagram illustrating an example method of operation of the PWM frequency converter of FIG. 1 in accordance with at least one embodiment of the present invention.

FIG. 2 illustrates a method 200 of operation of the PWM frequency converter 100 of FIG. 1 in accordance with at least one embodiment of the present disclosure. Blocks 202, 204, 206, and 208 of method 200 represent the sampling process performed by the sampling module 106, blocks 210, 212, 214, 216, 218, 220, and 222 represent the filtering process performed by the filter module 108, and blocks 224, 226, and 228 represent the PWM generation process performed by the PWM generator module 110.

At block 202, the PWM frequency converter 100 is initialized by initializing the sampling module 106 in preparation for sampling a PWM cycle of the input PWM signal 102. In sampling the input PWM signal 102, the sampling module 106 employs two variables or values: N_total, which represents the total number of samples taken over a PWM cycle being sampled; N_high, which represents the number of samples taken over the PWM cycle that have a select sample value (e.g., logic "high" or "1" for this example). For the filtering, the filter module 108 uses four additional values or variables: N_H0, which represents a historical or baseline number of samples over any thus-far sampled PWM cycle that have the select sample value; and N_T0, which represents a historical or baseline total number of samples over any thus-far sampled PWM cycle; N_H, which represents the number of samples that have the select sample value to be used in calculating the duty ratio for the generated PWM cycle; and N_T, which represents the total number of samples to be used in calculating the duty ratio for the generated PWM cycle. Accordingly, the filter module 108 can be initialized at block 202 before sampling the first PWM cycle to be sampled by setting at least N_T0 and N_H0 to 0 so as to set the baseline for these values to zero for comparison purposes.

At block 204, the sample module 106 samples a PWM cycle of the input PWM signal 102 using the sampling clock 122 to drive the sampling frequency. As illustrated by FIG. 2, this sampling process can include the sampling module 106 determining, at block 206, the number (N_high) of samples over the PWM cycle that have the select sample value, such by taking a sample of the input PWM signal 102 and then incrementing a counter if the sample has the select sample value. The sampling process also can include the sampling module 106 determining, at block 208, the total number of samples taken over the PWM cycle of the input PWM signal 102 (N_total). To illustrate, for a high-first PWM cycle, the sampling module 106 can reset a counter upon detecting a rising edge and then increment the counter until the next rising edge is detected, at which point the counter value at the time of the next rising edge represents the total number of samples taken during the PWM cycle. For a low-first PWM cycle, the sampling module 106 can reset a counter upon detecting a falling edge and then increment the counter until the next falling edge. The sampling module 106 then provides the determined values N_total and N_high to the filter module 108 as the set of raw PWM parameters 126.

At block 210, the filter module 108 determines whether the difference between the value N_high (i.e., the number of "high" samples in the sampled PWM cycle) and the value N_H0 is greater than or equal to a predetermined change threshold. As will be understood from the further description below, the value N_H0 represents a filtered or baseline number of high samples from one or more previous sampled PWM cycles. Thus, at block 210 the filter module 108 determines whether the number of high samples from the PWM cycle most recently sampled is within a change threshold range of a historical number of high PWM samples, where the change threshold range is defined by the predetermined change threshold. If outside the change threshold range (i.e., the difference between these values is greater than or equal to the predetermined change threshold), at block 212 the filter module 108 sets N_H to the value N_high. As discussed below, the value N_H is used to calculate (in combination with a value N_T) the duty ratio for a corresponding PWM cycle of the output PWM signal 104 to be generated, and thus setting the value N_H to the value N_high at block 212 results in the number of high samples determined for most recently sampled PWM cycle acting to control the duty cycle of the corresponding PWM cycle to be generated for the output PWM signal 104. Otherwise, if the number of samples having the select sample value (N_high) is within the change threshold range of the historical value (i.e., if the difference between the values N_high and N_H0 is less than the predetermined change threshold), at block 214 N_H is instead set to the value N_H0, with the result that the duty ratio for the corresponding PWM cycle of the output PWM signal 104 being set based on the historical or baseline number of high samples from a previous PWM cycle.

A similar filtering process is used to set the value N_T based on the value N_total. At block 216, the filter module 108 determines whether the value N_total (i.e., the total number of samples in the sampled PWM cycle) is within a change threshold range of the value N_T0, where the change threshold range for block 216 can be defined by the same predetermined change threshold as at block 210 or by a separate predetermined change threshold. As described below, the value N_T0 represents a historical or baseline total number of samples from one or more previous sampled PWM cycles and the filter module 108 therefore determines whether the total number of samples from the PWM cycle most recently sampled is within the change threshold range (i.e., to what degree the total number of samples differs from the a historical total number of PWM samples). If the difference between these values is greater than or equal to the predetermined change threshold, at block 218 the filter module 108 sets N_T to the value N_total. As such, the total number of samples from the most-recently sampled PWM cycle would act to control the duty cycle of the corresponding PWM cycle to be generated for the output PWM signal 104. Otherwise, if the difference between the values N_total and N_T0 is less than the predetermined change threshold, at block 220 the value N_T is instead set to the value N_T0, with the result that the duty ratio for the corresponding PWM cycle of the output PWM signal 104 being set based on the historical or baseline total number of samples from a previous PWM cycle. At block 222, the value N_H0 is set to the value N_H (thereby setting the historical or baseline number of high samples per PWM cycle to the number of high samples used to determine the duty ratio of the corresponding PWM cycle to be generated) and the value N_T0 is set to the value N_T (thereby setting the historical or baseline total number of samples per PWM cycle to the total number of samples used to determine the duty ratio of the corresponding PWM cycle to be generated).

As discussed above and in greater detail below, the values N_H and N_T are used to determine the duty ratio for a PWM cycle to be generated for the output signal 104. Thus, the filtering provided by changing the values of N_H from its historical value (represented by N_H0) to the value N_high determined for the most-recently sampled PWM cycle only when the difference between the historical value of N_H and the current value N_high is greater than or equal to a change threshold range defined by the predetermined change threshold (and likewise for the value N_T with respect to its historical value N_T0 and the currently determined value N_total) provides a degree of noise filtering, thereby reducing the potential for erroneous and inconsistent calculation of the duty ratio of the PWM cycle being sampled and for the erroneous and inconsistent generation of the duty ratio for the corresponding PWM cycle of the output PWM signal 104.

At block 222, the historical value N_H0 is set to the current value of N_H determined from blocks 210-214 and the historical value N_T0 is set to the current value of N_T determined from blocks 216-220. The sampling process of blocks 204-220 then may be repeated for the next PWM cycle of the input PWM signal 102. In parallel, the current values for N_H and N_T from the sampled PWM cycle are provided to the PWM generator module 110 as the filtered PWM parameters 128.

At block 224 the PWM generator module 110 determines the duty ratio of the sampled PWM cycle (and thus the duty ratio of the PWM cycle to be generated) based on the values N_H and N_T. In one embodiment, the duty ratio is calculated as the ratio of the number of high samples (N_H) to the total number of samples for the sampled PWM cycle (N_T), i.e., N_H/N_T. Alternately, the number of low samples (N_L) in the sampled PWM cycle may be tracked, and the duty ratio therefore may be calculated as (N_T−N_L)/N_T. Further, as described below with reference to FIG. 5, the PWM generator module 110 calculates a duty value (PWM_Duty) as a product of the duty ratio and the PWM step range (R) of the output PWM signal 104, i.e., PWM_Duty=R*(N_H/N_T). To illustrate, assuming that N_H=50, N_T=120, and the output PWM signal has an eight-bit PWM step range (i.e., R=2^8−1 or 255 steps), the value of PWM_Duty is calculated as 255*(50/120)=106.25, which may be truncated (or rounded) to 106 to generate an integer value. At block 226, the PWM generator module 110 generates a corresponding PWM cycle of the output PWM signal 104 using the duty value PWM_Duty to control the duty ratio of the generated PWM cycle, as described in detail below with reference to FIG. 5. At block 228, the output PWM signal 104 with the generated PWM cycle then can be provided to a destination module to drive or otherwise control the operation of the destination module, such as using the output PWM signal 104 to drive a motor or to activate/deactivate LEDs of a display.

Figure 3:
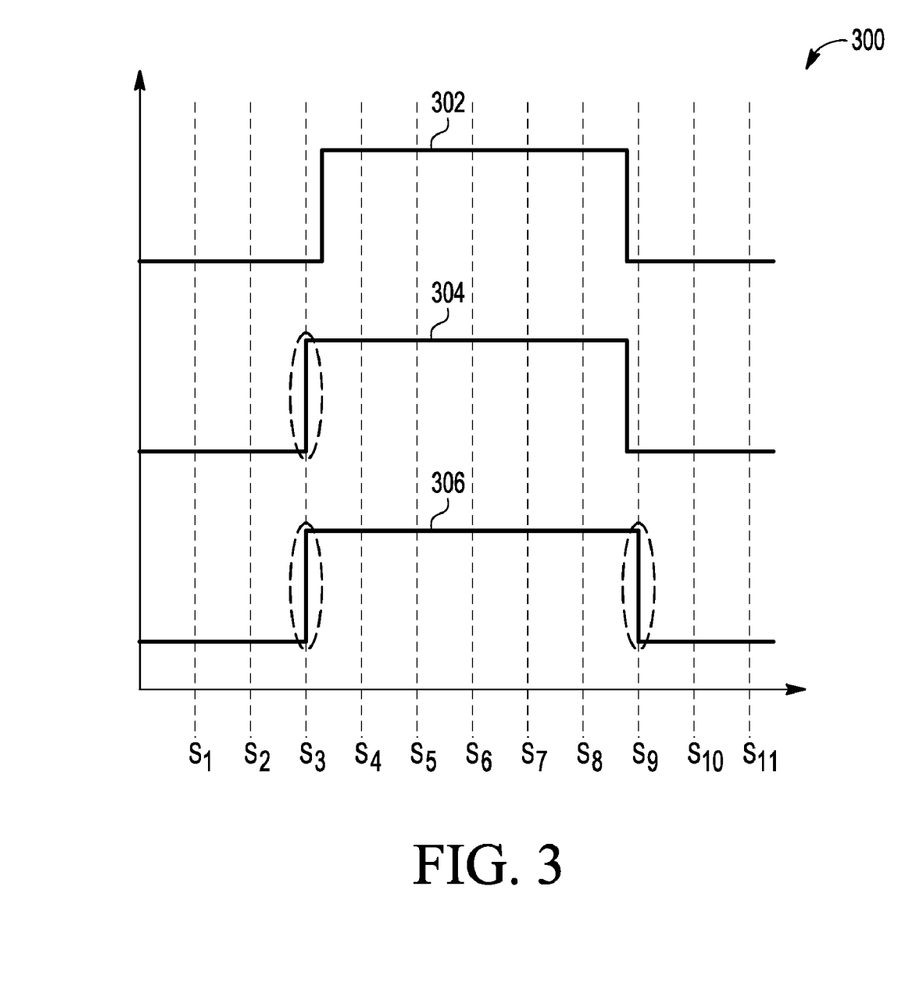
FIG. 3 is a diagram illustrating the introduction of sampling inconsistencies due to clock jitter and other manifestations of non-synchronization of a sampling clock during sampling of an input PWM signal in accordance with at least one embodiment of the present invention.

For the filtering process applied at blocks 210, 212, 214, 216, 218, and 220, the predetermined change threshold defines the degree to which the current value must differ from the historical value before the current value is used in place of the historical value. Thus, an appropriate value for the change threshold is selected so as to compensate for potential clock jitter, clock mismatch, ambient variations and other deterministic artifacts or random errors that can introduce noise into the calculation of the current value. Ideally, the change threshold also may be selected so as to further assist the PWM frequency converter 100 to meet specified PWM performance requirements, such as a 1 LSB of the PWM step resolution or the ability to provide a PWM signal with a duty ratio across the full range from 0% to 100%. While the predetermined change threshold can be selected as any value one or greater, the inventors have determined that the circumstances of the sampling process introduce up to two potential sampling discrepancies, and thus a predetermined change threshold greater of three (3) provides an optimal threshold for achieving the PWM performance parameters of a minimum PWM step resolution of 1 LSB and the ability to reproduce a 0% duty ratio in the output PWM signal 104. To illustrate, FIG. 3 depicts the sources of sampling discrepancies with respect to subsequent duty cycle calculation. In the depicted chart 300, eleven samples are taken at respective sample points $S_1$-$S_{11}$ for each of three PWM signals 302, 304, and 306. Although eleven sample points are depicted for ease of illustration, it will be appreciated that the number of samples taken within a given PWM cycle typically will be higher to provide a sufficient sampling resolution.

As illustrated by PWM signal 302, when the rising and falling edges of the PWM signal occur between sample points (e.g., between sample points $S_3$ and $S_4$ and between sample points $S_8$ and $S_9$), there is little potential for an inconsistent sampling measurement. However, as illustrated by PWM signal 304, when one of the edges of the PWM signal occurs in proximity to a sample point (e.g., the rising edge of the PWM signal 304 occurring at sample point $S_3$), a sampling inconsistency can occur, and thus the determined number of high samples (N_high) for the PWM signal 304 could be either of two values. To illustrate, in FIG. 3 the value N_high would be six (6) if the sample of PWM signal 304 at sample point $S_3$ is interpreted as a high sample value, whereas the value N_high would be five (5) if the sample of PWM signal 304 at sample point $S_3$ is interpreted as a low sample value. Thus, with a total number of eleven (11) samples for the PWM cycle of PWM signal 304 (N_total=11), the measured duty ratio be either 54.5% (6/11) or 45.4% (5/11) depending on what value the rising edge happens to be assigned at sample point $S_3$. As illustrated by PWM signal 306, the indeterminate nature of the sampling process can be further exacerbated when both the rising edge and the falling edge of a sampled PWM cycle occur in proximity to corresponding sample points. As the rising edge occurring at sample point $S_3$ could happen to be interpreted as either a high sample value or a low sample value and likewise with the falling edge occurring at sample point $S_9$, the number of high samples for the illustrated PWM cycle of the PWM signal 306 could be any of five (5), six (6), or seven (7), leading to the potential for the duty ratio of the sampled PWM cycle to be interpreted as either 45.4%, 54.5%, or 63.6%. In the absence of the history-based filtering of the sampling parameters as described above, this indeterminacy in the sampling could otherwise lead to frequent and substantial changes in the duty ratios of successive PWM cycles of the output PWM signal 104 even though a constant duty ratio may be maintained for the PWM cycles of the input PWM signal 104. Thus, as there are two potential points for sampling inconsistencies in a given PWM cycle (one at the rising edge, one at the falling edge), the change threshold applied by the filter module 108 can be set to three (3) to account for these two potential sampling inconsistencies.

While a change threshold of three (3) is well-suited in view of the characteristics of the sampling process, thresholds other than the value of three may be implemented without departing from the scope of the present disclosure. However, for larger thresholds, a higher number of samples per PWM cycle is needed to achieve certain performance goals, such as a minimum PWM duty of 0% or a minimum PWM resolution step of 1 LSB. To illustrate, for the output PWM signal 104 with, for example, an 8-bit resolution (255 steps) and a total of 450 samples per PWM cycle (N_total=450), the minimum PWM step when the change threshold is 1 LSB (trunc[3/450× 255]=1 LSB). However, for a change threshold set to 4 with the same number of samples, the minimum PWM step is 2 LSB (trunc[4/450×255]=2 LSB). To achieve 1 LSB with a change threshold of 4, the total number of samples per PWM cycle would need to be increased to at least 511 samples per PWM cycle. Accordingly, in one embodiment, the sampling clock 122 is configured or selected to provide a sampling frequency for the sampling module 106 such that a truncated or rounded \product of the PWM step range R and a ratio of the predetermined change threshold to the total number of samples N_total is not greater than 1 LSB of the PWM step resolution.

Figure 4:
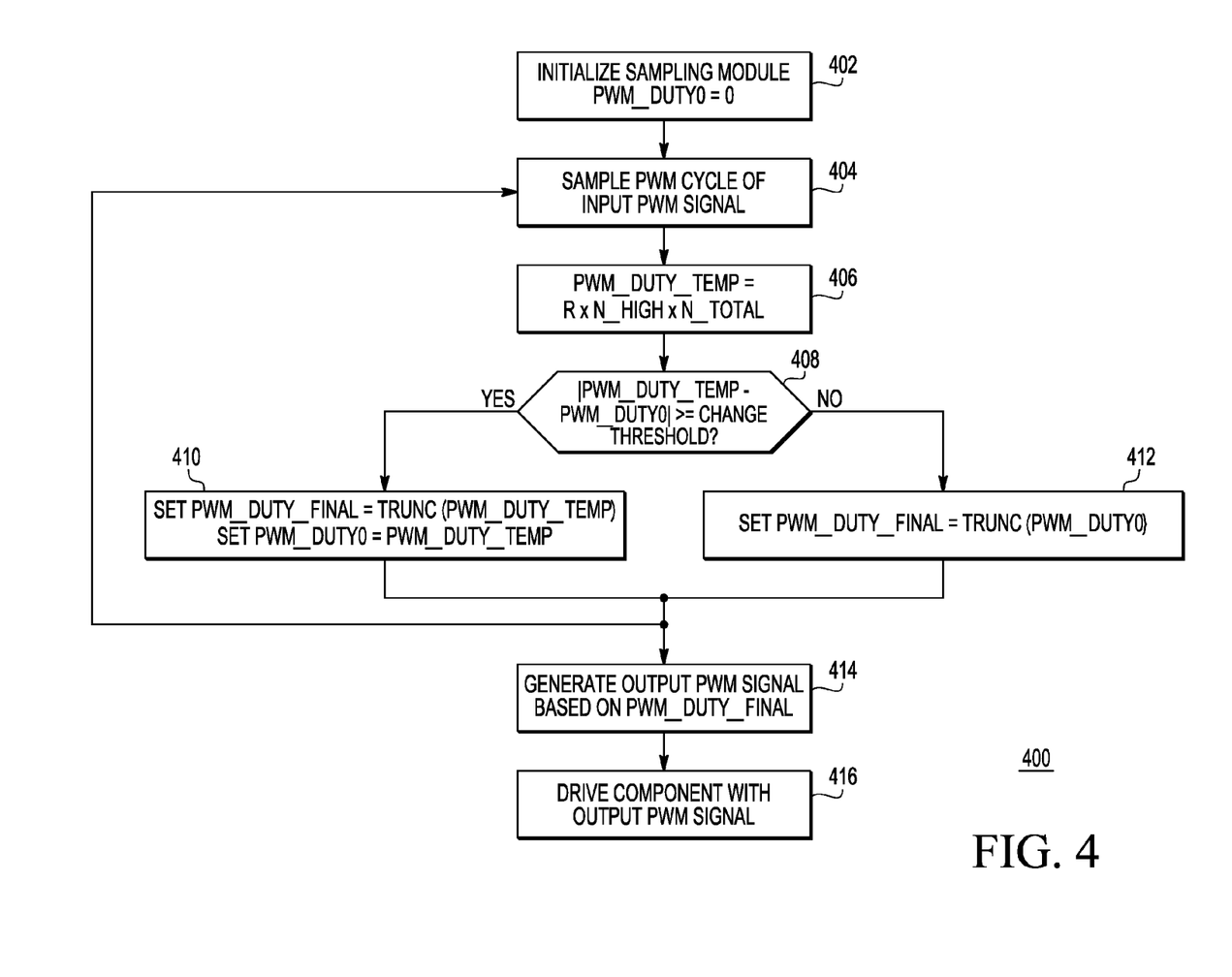
FIG. 4 is a flow diagram illustrating a method of operation of the PWM frequency converter of FIG. 1 in accordance with at least one embodiment of the present disclosure.

FIG. 4 illustrates another method 400 of operation of the PWM frequency converter 100 of FIG. 1 in accordance with at least one embodiment of the present disclosure. Blocks 402 and 404 of method 400 represent the sampling process performed by the sampling module 106, blocks 406, 408, 410, and 412 represent the filtering process performed by the filter module 108, and blocks 414 and 416 represent the PWM generation process performed by the PWM generator module 110. In contrast with the method 200 of FIG. 2, the method 400 first calculates a temporary representation of the PWM duty ratio (PWM_Duty_Temp) of the input PWM signal 102 and then filters this PWM parameter based on a predetermined change threshold and a previous or historical PWM duty ratio determined from a sampling of a prior PWM cycle.

At block 402, the PWM frequency converter 100 is initialized by initializing the sampling module 106 in preparation for sampling a PWM cycle of the input PWM signal 102. In sampling the input PWM signal 102, the sampling module 106 employs the two variables or values, N_total and N_high, discussed above. For the filtering of method 400, the filter module 108 uses three additional values or variables: PWM_Duty0, which represents a historical or baseline PWM duty ratio over any thus-far sampled PWM cycle; and PWM_Duty_Temp, which represents the PWM duty ratio of the PWM cycle currently sampled (and calculated using N_total and N_high); and PWM_Duty_Final, which represents the PWM duty ratio resulting from filtering of PWM_Duty_Temp based on PWM_Duty0 and a preselected change threshold. Accordingly, the filter module 108 can be initialized at block 402 before sampling the first PWM cycle to be sampled by setting at least N_total, N_high, PWM_Duty0, PWM_Duty_Temp, and PWM_Duty_Final to 0 so as to set the baseline for these values to zero for comparison purposes.

At block 404, the sample module 106 samples a PWM cycle of the input PWM signal 102 using the sampling clock 122 to drive the sampling frequency to determine the number (N_high) of samples over the PWM cycle that have the select sample value and the total number of samples taken over the PWM cycle of the input PWM signal 102 (N_total), as discussed above with respect to blocks 204, 206, and 208 of FIG. 2.

At block 406, the filter module 108 determines the value for PWM_Duty_Temp using the values for N_high and N_total. To illustrate, in one embodiment the value for PWM_Duty_Temp is calculated as a product of the duty ratio and the PWM step range (R) of the output PWM signal 104, i.e., PWM_Duty_Temp=R*(N_high/N_total). At block 408, the filter module 108 determines whether the difference between the value PWM_Duty_Temp (i.e., measured duty ratio of the sampled PWM cycle) and PWM_Duty0 (i.e., the historical duty ratio from a previous sampled PWM cycle) is greater than or equal to a predetermined change threshold. The predetermined change threshold can be selected to accommodate for the two potential sampling errors described above in FIG. 3 by calculating the change threshold based on one or more of the expected number of total samples per PWM cycle, the PWM step range (R), and the like. In at least one embodiment, the values for PWM_Duty_Temp and PWM_Duty0 are maintained as decimal numbers so that the change threshold can also be implemented as a decimal number so as to allow for a wider or narrower change threshold as desired. To illustrate, the change threshold could be set at any of, for example, 0.25, 0.5, 1.0, 1.5, or 2.0, depending on the particular expected ranges for the values used to calculate PWM_Duty_Temp and the desired sensitivity of the filter module 108.

In the event that the difference between PWM_Duty_Temp and PWM_Duty0 exceeds the change threshold, at block 410 the filter module 108 sets PWM_Duty_Final to an integer representation of PWM_Duty_Temp and sets the PWM_Duty0 to PWM_Duty_Temp so that the current PWM_Duty_Temp is used as the historic PWM duty value for the next sampled PWM cycle. Otherwise, if the difference between PWM_Duty_Temp and PWM_Duty0 does not exceed the change threshold, at block 412 the filter module 108 sets PWM_Duty_Final to the integer representation of the historic PWM duty (PWM_Duty0).

The sampling process of blocks 404-412 is be repeated for the next PWM cycle of the input PWM signal 102. In parallel, the value of PWM_Duty_Final from the sampled PWM cycle is provided to the PWM generator module 110 as the filtered PWM parameters 128. At block 414, the PWM generator module 110 generates a corresponding PWM cycle of the output PWM signal 104 using the duty value PWM_Duty_Final to control the duty ratio of the generated PWM cycle, as described in detail below with reference to FIG. 5. At block 416, the output PWM signal 104 with the generated PWM cycle then can be provided to a destination module to drive or otherwise control the operation of the destination module, such as using the output PWM signal 104 to drive a motor or to activate/deactivate LEDs of a display.

Figure 5:
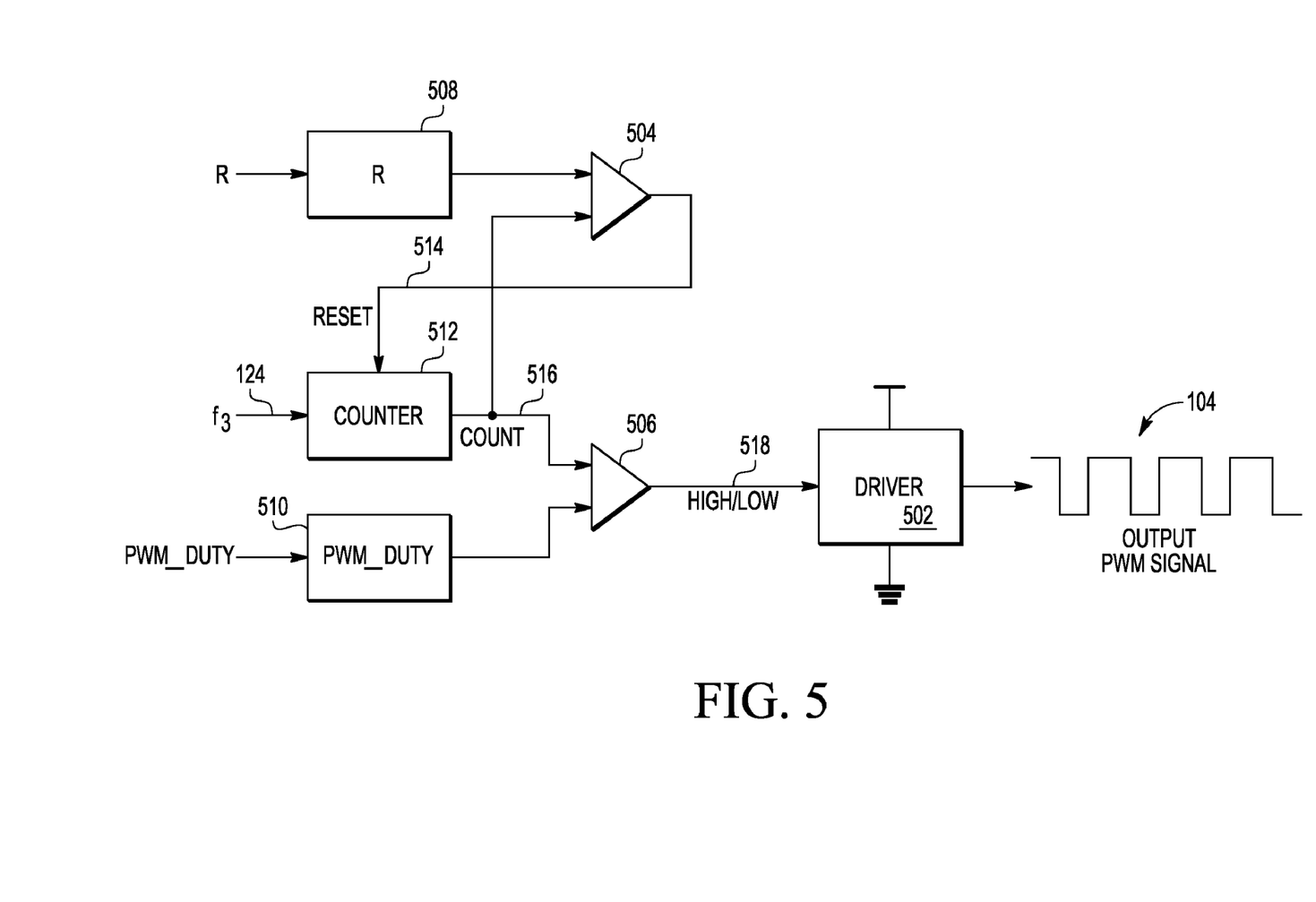
FIG. 5 is a diagram illustrating a PWM generator module of the PWM frequency converter of FIG. 1 for generating an output PWM signal based on filtering of sampling results from an input PWM signal in accordance with at least one embodiment of the present disclosure.

FIG. 5 illustrates an example implementation of the PWM generator module 110 for generating a high-first PWM cycle of the output PWM signal 104 in accordance with at least one embodiment of the present disclosure. A similar configuration may be implemented to generate a low-first PWM cycle using the guidelines provided herein. In the illustrated example, the PWM generator module 110 includes an output driver 502, digital comparators 504 and 506, registers 508 and 510, and a counter 512. The register 508 stores the output PWM step range value R (e.g., 255 for an 8-bit PWM step resolution) and register 510 stores the duty value PWM_Duty (or PWM_Duty_Final) determined from the filtered PWM parameters 128 as described above. The counter 512 includes a clock input to receive generation clock 124 (having frequency $f_3$), a reset input to receive a reset signal 514, and an output to provide a count 516, whereby the counter 512 is configured to initialize the count 516 to zero in response to an assertion of the reset signal 516 and then increment the count 516 for each cycle of the generation clock 124 until the next reset event. The digital comparator 504 includes an input to receive the PWM step range value R from the register 508, an input to receive the count 516, and an output to provide the reset signal 514, wherein the digital comparator 504 asserts the reset signal 514 when the count 516 reaches the PWM step range value R and otherwise maintains the reset signal 514 in a deasserted state when the count 516 is less than the PWM step range value R. The digital comparator 506 includes an input to receive the count 516, and input to receive the duty value PWM_Duty from the register 510, and an output to provide a high/low signal 518, whereby the digital comparator 506 asserts the high/low signal 518 when the count 516 is less than or equal to the duty value PWM_Duty and otherwise maintains the high/low signal 518 in a deasserted state when the count 516 is greater than the duty value PWM_Duty. The driver 502 includes an input to receive the high/low signal 518 and an output to provide the output PWM signal 104, whereby the driver 502 pulls the output PWM signal 104 high (e.g., to voltage reference $V_{DD}$) when the high/low signal 518 is asserted and otherwise pulls the PWM signal 104 low (e.g., to ground or voltage reference $V_{SS}$) when the high/low signal 518 is unasserted.

Figure 6:
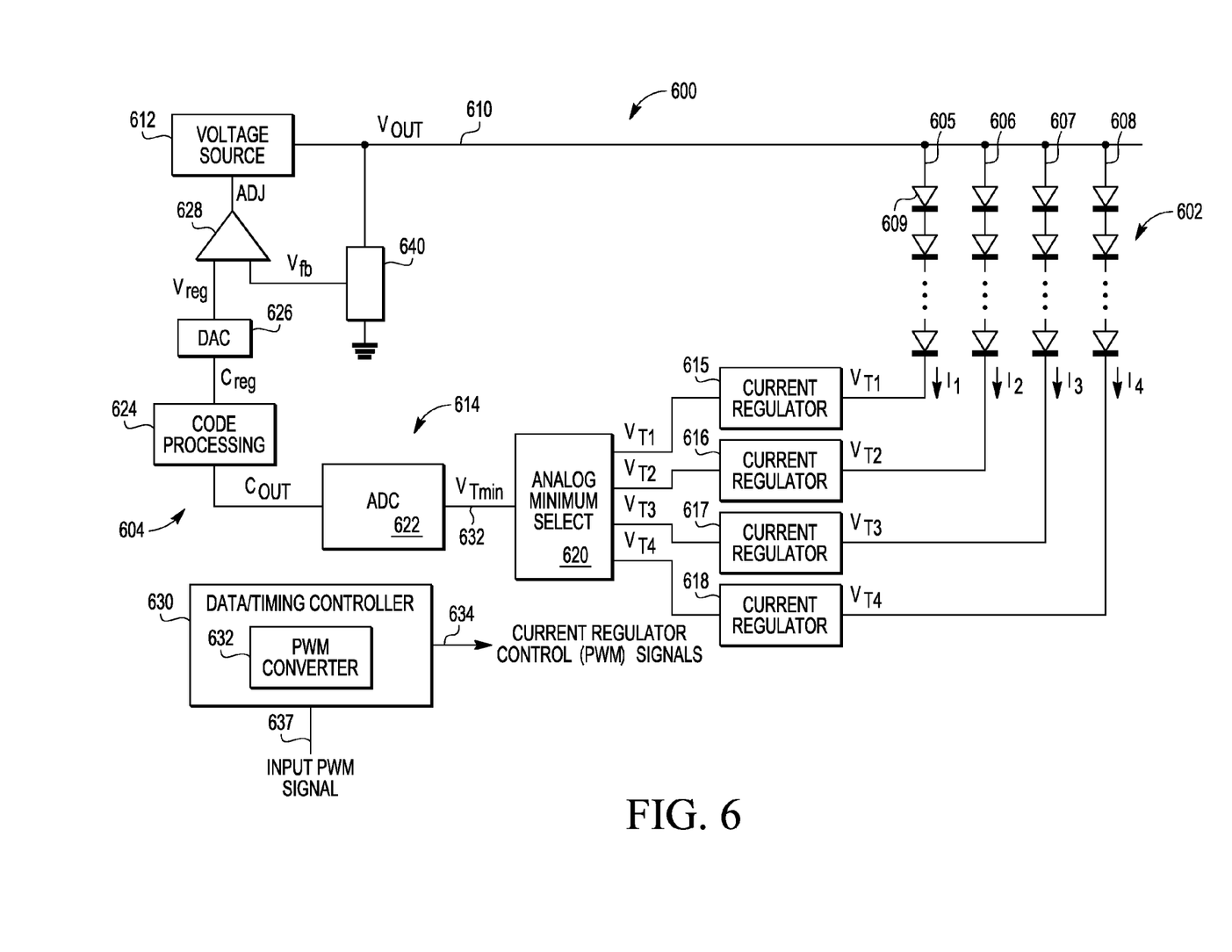
FIG. 6 is a diagram illustrating an example light emitting diode (LED) system implementing the PWM frequency converter of FIG. 1 in accordance with at least one embodiment of the present invention.
Figure 7:
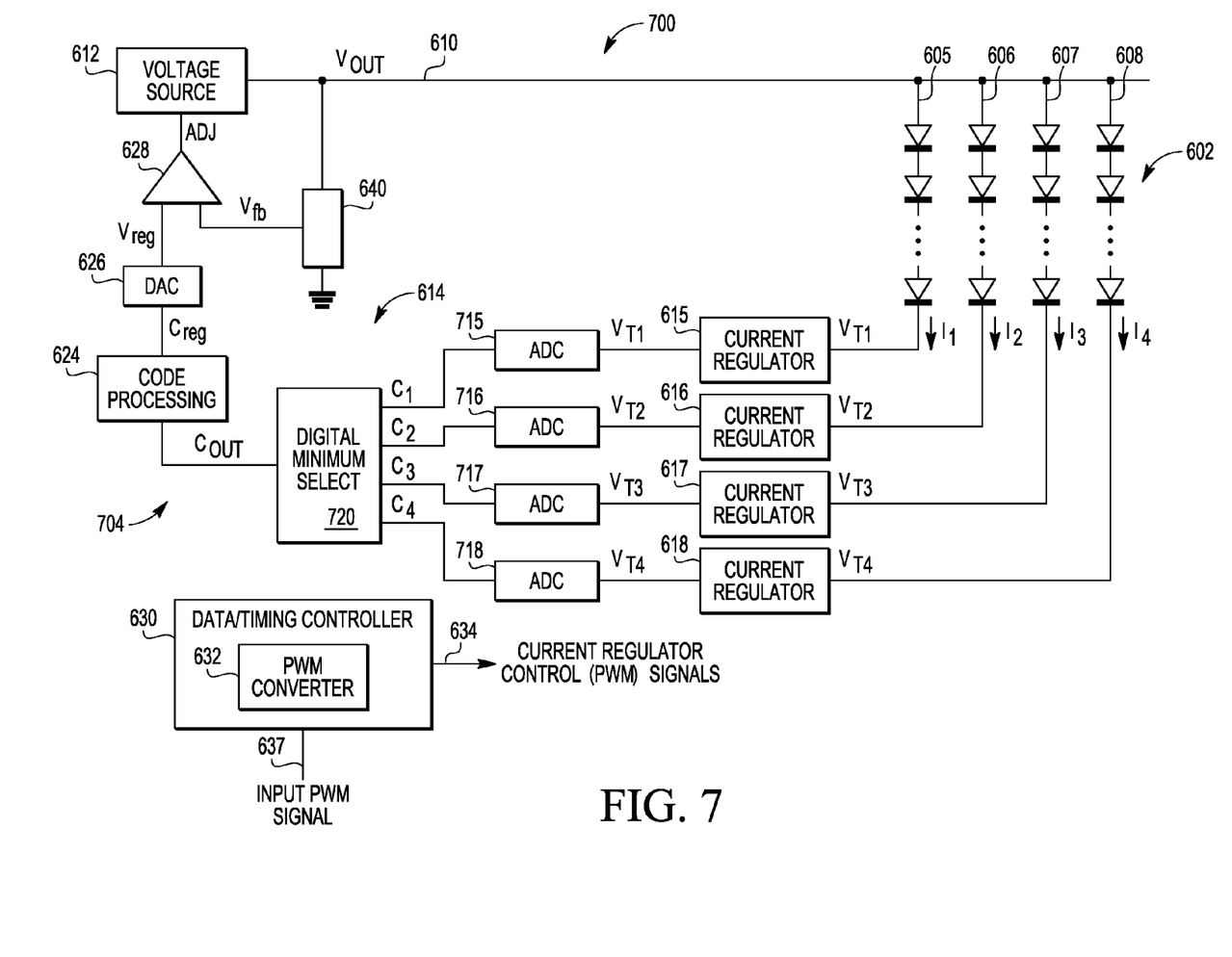
FIG. 7 is a diagram illustrating another example LED system implementing the PWM frequency converter of FIG. 1 in accordance with at least one embodiment of the present invention.

FIGS. 6 and 7 illustrate example implementations of the PWM frequency converter of FIG. 1 for dynamic power management in a light emitting diode (LED) system having a plurality of LED strings. The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

FIG. 6 illustrates a LED system 600 having dynamic power management in accordance with at least one embodiment of the present disclosure. In the depicted example, the LED system 600 includes a LED panel 602 and a LED driver 604. The LED panel 602 includes a plurality of LED strings (e.g., LED strings 605, 606, 607, and 608). Each LED string includes one or more LEDs 609 connected in series. The LEDs 609 can include, for example, white LEDs, red, green, blue (RGB) LEDs, organic LEDs (OLEDs), etc. Each LED string is driven by the adjustable voltage $V_{OUT}$ received at the head end of the LED string from a voltage source 612 of the LED driver 604 via a voltage bus 610 (e.g., a conductive trace, wire, etc.). In the embodiment of FIG. 6, the voltage source 612 is implemented as a boost converter configured to drive the output voltage $V_{OUT}$ using a supplied input voltage.

The LED driver 604 includes a feedback controller 614 configured to control the voltage source 612 based on the tail voltages at the tail ends of the LED strings 605-608. The LED driver 604, in one embodiment, receives display data representative of which of the LED strings 605-608 are to be activated and at what times during a corresponding pulse width modulation (PWM) cycle, and the LED driver 604 is configured to either collectively or individually activate the LED strings 605-608 at the appropriate times in their respective PWM cycles based on the display data.

The feedback controller 614, in one embodiment, includes a plurality of current regulators (e.g., current regulators 615, 616, 617, and 618), an analog string select module 620, an ADC 622, a code processing module 624, a control digital-to-analog converter (DAC) 626, an error amplifier 628, and a data/timing controller 630. The data/timing controller 630 includes a PWM frequency converter 632 (corresponding to the PWM frequency converter 100, FIG. 1).

In the example of FIG. 6, the current regulator 615 is configured to maintain the current $I_1$ flowing through the LED string 605 at or near a fixed current (e.g., 30 mA) when active. Likewise, the current regulators 616, 617, and 618 are configured to maintain the currents $I_2$, $I_3$, and $I_4$ flowing through the LED strings 606, 607, and 608, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 615-618 are connected to the tail ends of the LED strings 605-608, respectively, the tail voltages of the LED strings 605-608 represent the amounts of headroom available at the corresponding current regulators 615-618. However, headroom in excess of that necessary for current regulation purposes results in unnecessary power consumption by the current regulator. Accordingly, as described in greater detail herein, the LED system 600 employs techniques to provide dynamic headroom control so as to maintain the minimum tail voltage of the active LED strings at or near a predetermined threshold voltage, thus maintaining the lowest headroom of the current regulators 615-618 at or near the predetermined threshold voltage. The threshold voltage can represent a determined balance between the need for sufficient headroom to permit proper current regulation by the current regulators 615-618 and the advantage of reduced power consumption by reducing the excess headroom at the current regulators 615-618.

The data/timing controller 630 receives an input PWM signal 633 provided to control LED strings 605-608. Typically, this input PWM signal 633 has a frequency of less than 20 kHz and therefore would be audible to a viewer if used to directly driver the current regulators 615-618, as well as being more susceptible ripple in the voltage $V_{OUT}$. Accordingly, the PWM frequency converter 632 converts the input PWM signal 633 to a higher frequency while maintaining the original duty ratio using the process described above. The resulting PWM signal 634 then is provided as control signaling for the current regulators 615-618 to control which of the LED strings 605-608 are active during corresponding portions of their respective PWM cycles.

The analog string select module 620 includes a plurality of tail inputs coupled to the tail ends of the LED strings 605-608 to receive the tail voltages $V_{T1}$, $V_{T2}$, $V_{T3}$, and $V_{T4}$ of the LED strings 605-608, respectively, and an output to provide an analog signal 632 representative of the minimum tail voltage $V_{Tmin}$ of the LED strings 605-608 at any given point over a detection period. In one embodiment, the analog string select module 620 is implemented as a diode-OR circuit having a plurality of inputs connected to the tail ends of the LED strings 605-608 and an output to provide the analog signal 632.

The ADC 622 is configured to generate one or more digital code values $C_{OUT}$ representative of the voltage of the analog signal 632 at one or more corresponding sample points. The code processing module 624 includes an input to receive the one or more code values $C_{OUT}$ and an output to provide a code value $C_{reg}$ based on the minimum value of the received code values $C_{OUT}$ for a given detection period or a previous value for $C_{reg}$ from a previous detection period. As the code value $C_{OUT}$ represents the minimum tail voltage that occurred during the detection period (e.g., a PWM cycle, a display frame period, etc.) for all of the LED strings 605-608, the code processing module 624, in one embodiment, compares the code value $C_{OUT}$ to a threshold code value, $C_{thresh}$, and generates a code value $C_{reg}$ based on the comparison. The code processing module 624 can be implemented as hardware, software executed by one or more processors, or a combination thereof. To illustrate, the code processing module 624 can be implemented as a logic-based hardware state machine, software executed by a processor, and the like.

The control DAC 626 includes an input to receive the code value $C_{reg}$ and an output to provide a regulation voltage $V_{reg}$ representative of the code value $C_{reg}$. The regulation voltage $V_{reg}$ is provided to the error amplifier 628. The error amplifier 628 also receives a feedback voltage $V_{fb}$ representative of the output voltage $V_{OUT}$. In the illustrated embodiment, a voltage divider 640 is used to generate the voltage $V_{fb}$ from the output voltage $V_{OUT}$. The error amplifier 628 compares the voltage $V_{fb}$ and the voltage $V_{reg}$ and configures a signal ADJ based on this comparison. The voltage source 612 receives the signal ADJ and adjusts the output voltage $V_{OUT}$ based on the magnitude of the signal ADJ.

FIG. 7 illustrates an alternate implementation of the feedback controller in the LED system 600 of FIG. 6. Rather than utilizing a single ADC to convert the minimum tail voltage of the multiple LED strings at any given time as described in FIG. 6, the depicted LED system 700 of FIG. 7 utilizes an ADC for each LED string. Accordingly, the LED driver 704 of FIG. 7 includes a plurality of ADCs 715, 716, 717, and 718 and a digital minimum select module 720. The ADC 715 includes an input coupled to the tail end of the LED string 605 and an output to provide one or more code values $C_1$ representative of the voltage of the tail end of the LED string 605 at a corresponding sample point. The ADCs 716-718 are similarly configured with respect to LED strings 606-608 for the generation of one or more code values $C_2$, $C_3$, and $C_4$, respectively, for the corresponding one or more sample points. At the end of a detection period, the digital minimum select module 720 identifies the lowest of the received code values and forwards this lowest code value as the code value $C_{OUT}$ for processing by the code processing module 624 as described above.

There may be considerable variation between the voltage drops across each of the LED strings 605-608 in the LED systems 600 and 700 due to static variations in forward-voltage biases of the LEDs 609 of each LED string and dynamic variations due to the on/off cycling of the LEDs 609. Thus, there may be significant variance in the bias voltages needed to properly operate the LED strings 605-1108. However, rather than drive a fixed output voltage $V_{OUT}$ that is substantially higher than what is needed for the smallest voltage drop as this is handled in conventional LED drivers, the LED driver 604 illustrated in FIG. 6 utilizes a feedback mechanism that permits the output voltage $V_{OUT}$ to be adjusted so as to reduce or minimize the power consumption of the LED driver 604 in the presence of variances in voltage drop across the LED strings 605-1108. Further, by converting the frequency of the input PWM signal 633 to a higher frequency, the LED drivers 604 and 704 can experience less voltage droop at the output voltage $V_{OUT}$, as well as operate the current regulators 615-618 at a frequency undetectable to the viewer. Moreover, by using the history-based filtering process described above to determine a representative duty ratio from the sampled input PWM cycle, blinking of the LED strings 605-608 due to unintended jumps in the duty ratio of the output PWM signal 634 can be minimized or avoided.

In a pulse width modulation (PWM) frequency converter that receives a first PWM signal and outputs a second PWM signal having a different frequency than the first PWM signal, a method is provided. In one aspect, the method includes sampling a first PWM cycle of the first PWM signal to generate a first set of one or more PWM parameters and filtering the first set of one or more PWM parameters based on a predetermined change threshold to generate a second set of one or more PWM parameters. The method further includes generating a second PWM cycle for the second PWM signal based on the second set of one or more PWM parameters. In one embodiment, generating the second PWM cycle comprises determining a duty ratio of the first PWM cycle using the second set of one or more PWM parameters and generating the second PWM cycle so as to have a duty cycle substantially equal to the duty ratio determined for the first PWM cycle.

In accordance with one aspect, sampling the first PWM cycle comprises sampling the first PWM cycle to determine a first value and a second value of the first set of one or more PWM parameters, the first value representative of a number of samples having a select sample value for the first PWM cycle and the second value representative of a total number of samples for the first PWM cycle. In this instance, filtering the first set of one or more PWM parameters to generate the second set of one or more PWM parameters can include filtering the first value based on a change threshold range defined by the predetermined change threshold to generate a third value of the second set of one or more PWM parameters and filtering the second value based on the change threshold range to generate a fourth value of the second set of one or more PWM parameters. Generating the second PWM cycle therefore may include determining a duty value based on a PWM step range of the second PWM signal and a ratio of the third value and the fourth value and generating the second PWM cycle based on the duty value. In one embodiment, the method further includes configuring a sampling frequency such that a truncated or rounded product of the PWM step range and a ratio of the predetermined change threshold to the second value is not greater than one least significant bit (LSB) of a PWM step resolution of the second PWM signal. Further, generating the second PWM cycle based on the duty value can include driving the second PWM signal to a first state for a first duration, the first duration having a number of cycles of a generation clock equal to the duty value and driving the second PWM signal to a second state for a second duration, the second duration having a number of cycles of the generation clock equal to a difference between the PWM step range and the duty value, wherein the second duration precedes or follows the first duration.

In one embodiment, filtering the first value based on the change threshold range to generate the third value includes: setting the third value equal to the first value in response to determining a difference between the first value and a fifth value is greater than or equal to the predetermined change threshold, wherein the fifth value represents a number of samples having the select sample value for a PWM cycle of the first PWM signal occurring prior to the first PWM cycle; and setting the third value equal to the fifth value in response to determining the difference between the first value and the fifth value is less than the predetermined change threshold. In this case, filtering the second value based on the change threshold range to generate the fourth value can include setting the fourth value equal to the second value in response to determining a difference between the second value and a sixth value is greater than or equal to the predetermined change threshold, wherein the sixth value represents a total number of samples for a PWM cycle of the first PWM signal occurring prior to the first PWM cycle and setting the fourth value equal to the sixth value in response to determining the difference between the second value and the sixth value is less than the predetermined change threshold.

In another embodiment, sampling the first PWM cycle includes sampling the first PWM cycle to determine a first value and a second value of the first set of one or more PWM parameters, the first value representative of a number of samples having a select sample value for the first PWM cycle and the second value representative of a total number of samples for the first PWM cycle. In this embodiment, filtering the first set of one or more PWM parameters to generate the second set of one or more PWM parameters can include determining a first duty value based on a ratio of the first value and the second value and filtering the first duty value based on a change threshold range defined by the predetermined change threshold to generate a second duty value of the second set of one or more PWM parameters. Filtering the first duty value based on the change threshold range to generate the second value can include setting the second value equal to the first value in response to determining a difference between the first duty value and a third value is greater than or equal to the predetermined change threshold, wherein the third duty value represents a PWM duty ratio of a PWM cycle of the first PWM signal occurring prior to the first PWM cycle and setting the second duty value equal to the third duty value in response to determining the difference between the first duty value and the third duty value is less than the predetermined change threshold.

In accordance with another aspect, a pulse width modulation (PWM) frequency converter is provided. The PWM frequency converter has an input to receive a first PWM signal and an output to provide a second PWM signal having a different frequency than the first PWM signal. The PWM frequency converter further includes a sampling module to sample a first PWM cycle of the first PWM signal to generate a first set of one or more PWM parameters, a filter module to filter the first set of one or more PWM parameters based on a predetermined change threshold to generate a second set of one or more PWM parameters, and a PWM generator module to generate a second PWM cycle for the second PWM signal based on the second set of one or more PWM parameters.

In a PWM frequency converter that receives a first PWM signal and outputs a second PWM signal having a higher frequency than the first PWM signal, a method is provided in accordance with yet another aspect. The method includes sampling a first PWM cycle of the first PWM signal to determine a first value and a second value, the first value representative of a number of samples having a select sample value for the first PWM cycle and the second value representative of a total number of samples for the first PWM cycle and sampling a second PWM cycle of the first PWM signal that occurs subsequent to the first PWM cycle to determine a third value and a fourth value, the third value representative of a number of samples having the select sample value for the second PWM cycle and the fourth value representative of a total number of samples for the second PWM cycle. The method further includes filtering the third value based on the first value and a predetermined change threshold to generate a fifth value and filtering the fourth value based on the second value and the predetermined change threshold to generate a sixth value. The method additionally includes generating a PWM cycle of the second PWM signal based on the fifth value and the sixth value.

In one embodiment, generating the PWM cycle of the second PWM signal includes determining a duty value based on a PWM step range of the second PWM signal and a ratio of the fifth value and the sixth value and generating the PWM cycle for the second PWM signal based on the duty value. Further, filtering the third value to generate the fifth value can include setting the fifth value equal to the third value in response to determining a difference between the third value and the first value is greater than or equal to the predetermined change threshold and setting the fifth value equal to the first value in response to determining the difference between the third value and the first value is less than the predetermined change threshold. Filtering the fourth value to generate the sixth value can include setting the sixth value equal to the fourth value in response to determining a difference between the fourth value and the second value is greater than or equal to the predetermined change threshold and setting the sixth value equal to the second value in response to determining the difference between the fourth value and the second value is less than the predetermined change threshold.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. In a pulse width modulation (PWM) frequency converter that receives a first PWM signal and outputs a second PWM signal having a different frequency than the first PWM signal, a method comprising:
   sampling a first PWM cycle of the first PWM signal to generate a first set of one or more PWM parameters, the sampling to determine a first value and a second value of the first set of one or more PWM parameters, the first value representative of a number of samples having a select sample value for the first PWM cycle and the second value representative of a total number of samples for the first PWM cycle;
   filtering the first set of one or more PWM parameters based on a predetermined change threshold to generate a second set of one or more PWM parameters, the filtering comprising:
      filtering the first value based on a change threshold range defined by the predetermined change threshold to generate a third value of the second set of one or more PWM parameters; and
      filtering the second value based on the change threshold range to generate a fourth value of the second set of one or more PWM parameters; and
   generating a second PWM cycle for the second PWM signal based on the second set of one or more PWM parameters.

2. The method of claim 1, wherein generating the second PWM cycle comprises:
   determining a duty ratio of the first PWM cycle using the second set of one or more PWM parameters; and
   generating the second PWM cycle so as to have a duty cycle substantially equal to the duty ratio determined for the first PWM cycle.

3. The method of claim 1, wherein generating the second PWM cycle comprises:
   determining a duty value based on a PWM step range of the second PWM signal and a ratio of the third value and the fourth value; and
   generating the second PWM cycle based on the duty value.

4. The method of claim 3, further comprising:
   configuring a sampling frequency such that a truncated or rounded product of the PWM step range and a ratio of the predetermined change threshold to the second value is not greater than one least significant bit (LSB) of a PWM step resolution of the second PWM signal.

5. The method of claim 3, wherein generating the second PWM cycle based on the duty value comprises:
   driving the second PWM signal to a first state for a first duration, the first duration having a number of cycles of a generation clock equal to the duty value; and
   driving the second PWM signal to a second state for a second duration, the second duration having a number of cycles of the generation clock equal to a difference between the PWM step range and the duty value, wherein the second duration precedes or follows the first duration.

6. The method of claim 1, wherein:
   filtering the first value based on the change threshold range to generate the third value comprises:
      setting the third value equal to the first value in response to determining a difference between the first value and a fifth value is greater than or equal to the predetermined change threshold, wherein the fifth value represents a number of samples having the select sample value for a PWM cycle of the first PWM signal occurring prior to the first PWM cycle; and
      setting the third value equal to the fifth value in response to determining the difference between the first value and the fifth value is less than the predetermined change threshold; and
   filtering the second value based on the change threshold range to generate the fourth value comprises:
      setting the fourth value equal to the second value in response to determining a difference between the second value and a sixth value is greater than or equal to the predetermined change threshold, wherein the sixth value represents a total number of samples for a PWM cycle of the first PWM signal occurring prior to the first PWM cycle; and
      setting the fourth value equal to the sixth value in response to determining the difference between the second value and the sixth value is less than the predetermined change threshold.

7. The method of claim 6, wherein the predetermined change threshold is three.

8. The method of claim 1 further comprising providing power to light emitting diodes of a display panel based on the second PWM signal.

9. A pulse width modulation (PWM) frequency converter having an input to receive a first PWM signal and an output to provide a second PWM signal having a different frequency than the first PWM signal, the PWM frequency converter comprising:
   a sampling module to sample a first PWM cycle of the first PWM signal to generate a first set of one or more PWM parameters, the sampling to determine a first value and a second value of the first set of one or more PWM parameters, the first value representative of a number of samples having a select sample value for the first PWM cycle and the second value representative of a total number of samples for the first PWM cycle;
   a filter module to filter the first set of one or more PWM parameters based on a predetermined change threshold to generate a second set of one or more PWM parameters by:
      filtering the first value based on a change threshold range defined by the predetermined change threshold to generate a third value of the second set of one or more PWM parameters; and
      filtering the second value based on the change threshold range to generate a fourth value of the second set of one or more PWM parameters; and
   a PWM generator module to generate a second PWM cycle for the second PWM signal based on the second set of one or more PWM parameters.

10. The PWM frequency converter of claim 9, wherein the PWM generator module is to generate the second PWM cycle by:
   determining a duty ratio of the first PWM cycle using the second set of one or more PWM parameters; and
   generating the second PWM cycle so as to have a duty cycle substantially equal to the duty ratio determined for the first PWM cycle.

11. The PWM frequency converter of claim 9, wherein the PWM generator module is to generate the second PWM cycle by:
   determining a duty value based on a PWM step resolution of the second PWM signal and a ratio of the third value and the fourth value; and
   generating the second PWM cycle based on the duty value.

12. The PWM frequency converter of claim 11, wherein the PWM generator module is to generate the second PWM cycle based on the duty value by:
   driving the second PWM signal to a first state for a first duration, the first duration having a number of cycles of a generation clock equal to the duty value; and
   driving the second PWM signal to a second state for a second duration, the second duration having a number of cycles of the generation clock equal to a difference between the PWM step resolution and the duty value, wherein the second duration precedes or follows the first duration.

13. The PWM frequency converter of claim 9, wherein:
   the filter module is to filter the first value to generate the third value by:
      setting the third value equal to the first value in response to determining a difference between the first value and a fifth value is greater than or equal to the predetermined change threshold, wherein the fifth value represents a number of samples having the select sample value for a PWM cycle of the first PWM signal occurring prior to the first PWM cycle; and
      setting the third value equal to the fifth value in response to determining the difference between the first value and the fifth value is less than the predetermined change threshold; and
   the filter module is to filter the second value based on the change threshold range to generate the fourth value by:
      setting the fourth value equal to the second value in response to determining a difference between the second value and a sixth value is greater than or equal to the predetermined change threshold, wherein the sixth value represents a total number of samples for a PWM cycle of the first PWM signal occurring prior to the first PWM cycle; and
      setting the fourth value equal to the sixth value in response to determining the difference between the second value and the sixth value is less than the predetermined change threshold.

14. The PWM frequency converter of claim 9 further comprising an interface for providing the second PWM signal to a current regulator associated with light emitting diodes of a display panel.

15. In a pulse width modulation (PWM) frequency converter that receives a first PWM signal and outputs a second PWM signal having a higher frequency than the first PWM signal, a method comprising:
- sampling a first PWM cycle of the first PWM signal to determine a first value and a second value, the first value representative of a number of samples having a select sample value for the first PWM cycle and the second value representative of a' total number of samples for the first PWM cycle;
- sampling a second PWM cycle of the first PWM signal that occurs subsequent to the first PWM cycle to determine a third value and a fourth value, the third value representative of a number of samples having the select sample value for the second PWM cycle and the fourth value representative of a total number of samples for the second PWM cycle;
- filtering the third value based on the first value and a predetermined change threshold to generate a fifth value;
- filtering the fourth value based on the second value and the predetermined change threshold to generate a sixth value; and
- generating a PWM cycle of the second PWM signal based on the fifth value and the sixth value.

16. The method of claim 15, wherein generating the PWM cycle of the second PWM signal comprises:
- determining a duty value based on a PWM step range of the second PWM signal and a ratio of the fifth value and the sixth value; and
- generating the PWM cycle for the second PWM signal based on the duty value.

17. The method of claim 15, wherein:
filtering the third value to generate the fifth value comprises:
- setting the fifth value equal to the third value in response to determining a difference between the third value and the first value is greater than or equal to the predetermined change threshold; and
- setting the fifth value equal to the first value in response to determining the difference between the third value and the first value is less than the predetermined change threshold; and filtering the fourth value to generate the sixth value comprises:
- setting the sixth value equal to the fourth value in response to determining a difference between the fourth value and the second value is greater than or equal to the predetermined change threshold; and
- setting the sixth value equal to the second value in response to determining the difference between the fourth value and the second value is less than the predetermined change threshold.

* * * * *